United States Patent
Raravikar et al.

(10) Patent No.: US 11,626,551 B1
(45) Date of Patent: Apr. 11, 2023

(54) BONDING ULTRA-DENSE BUMP ARRAYS USING ALIGNMENT BUMPS

(71) Applicant: Tectus Corporation, Saratoga, CA (US)

(72) Inventors: Nachiket Raghunath Raravikar, Saratoga, CA (US); Arnold Daguio, Gilroy, CA (US); Kwong-Hin Henry Choy, San Jose, CA (US); Tigran Nshanian, Santa Clara, CA (US); Paul Scott Martin, Palo Alto, CA (US)

(73) Assignee: Tectus Corporation, Saratoga, CA (US)

( * ) Notice: Subject to any disclaimer, the term of this patent is extended or adjusted under 35 U.S.C. 154(b) by 125 days.

(21) Appl. No.: 17/162,793

(22) Filed: Jan. 29, 2021

Related U.S. Application Data

(60) Provisional application No. 62/968,901, filed on Jan. 31, 2020.

(51) Int. Cl.
| | |
|---|---|
| *H01L 29/205* | (2006.01) |
| *H01L 33/00* | (2010.01) |
| *H01L 33/62* | (2010.01) |
| *H01L 23/00* | (2006.01) |
| *H01L 25/16* | (2023.01) |

(52) U.S. Cl.
CPC .......... *H01L 33/62* (2013.01); *H01L 24/16* (2013.01); *H01L 25/167* (2013.01); *H01L 2224/10125* (2013.01); *H01L 2224/16145* (2013.01)

(58) Field of Classification Search
CPC ....... H01L 33/62; H01L 24/16; H01L 25/167; H01L 2224/10125; H01L 2224/16145
See application file for complete search history.

(56) References Cited

U.S. PATENT DOCUMENTS

| | | | |
|---|---|---|---|
| 2007/0013063 A1* | 1/2007 | Khandekar | H05K 3/303 257/734 |
| 2011/0215466 A1* | 9/2011 | Hsu | H01L 23/544 257/737 |

(Continued)

OTHER PUBLICATIONS

"Flip-Chip Packaging for Nanoscale Silicon Logic Devices: Challenges and Opportunities," in Nano-packaging, J. E. Morris (ed.), D. Mallik, R. Mahajan, N. Raravikar, K. Radhakrishnan, K. Aygun, B. Sankman, Springer Nature, 2018, 36 pages.

(Continued)

*Primary Examiner* — Ismail A Muse
(74) *Attorney, Agent, or Firm* — Fenwick & West LLP

(57) ABSTRACT

Additional "auxiliary" bumps are used to stabilize alignment and reduce slippage of dense arrays of interconnect bumps on opposing die during a bonding process. One example of auxiliary bumps are interdigitated bumps. Interdigitated bumps are more self-aligning and laterally stable because bumps do not meet head-to-head. Rather, the head of a bump on one die falls into the space between bumps on the other die. Another example of auxiliary bumps are nail bumps. In nail bumps, one bump is harder (the nail) and "drives" into the opposing softer bump during bonding. This constrains the lateral movement of the two bumps relative to each other and reduces lateral slippage. In some embodiments, the auxiliary bumps and interconnect bumps are formed in the same process, and also bonded in the same process.

22 Claims, 18 Drawing Sheets

(56) References Cited

U.S. PATENT DOCUMENTS

| | | | |
|---|---|---|---|
| 2012/0032321 A1* | 2/2012 | West | H01L 23/49816 |
| | | | 257/737 |
| 2015/0123271 A1* | 5/2015 | Sylvestre | H01L 23/49811 |
| | | | 257/737 |
| 2016/0163564 A1* | 6/2016 | Yu | H01L 21/56 |
| | | | 438/126 |
| 2016/0372436 A1* | 12/2016 | Cheng | H01L 24/05 |
| 2021/0202420 A1* | 7/2021 | MacDougal | H01L 23/544 |

OTHER PUBLICATIONS

"Hybrid bonding for 3D stacked image sensors: impact of pitch shrinkage on interconnect robustness," J. Jourdan et al., proceedings of IEDM18 conference, 2018, 4 pages.

\* cited by examiner

BONDING ULTRA-DENSE BUMP ARRAYS USING ALIGNMENT BUMPS

CROSS-REFERENCE TO RELATED APPLICATION(S)

This application claims priority under 35 U.S.C. § 119(e) to U.S. Provisional Patent Application Ser. No. 62/968,901, "Interdigitated Bumps for Bonding Ultra-Dense LED Arrays," filed Jan. 31, 2020. The subject matter of all of the foregoing is incorporated herein by reference in its entirety.

BACKGROUND

1. Technical Field

This disclosure relates generally to bonding of dense arrays of bumps.

2. Description of Related Art

A micro LED display typically includes one die that contains the LEDs (the frontplane) and a separate die that contains the corresponding driver and control circuitry (the backplane). An important step in making micro LED displays is the process of attaching the frontplane die to the backplane die. At large sizes and pitches, each pixel on the LED die may be electrically connected to an interconnect bump, which may be metallurgically bonded to the corresponding interconnect bump on the logic die. However, for smaller pixel sizes and pitches, such as pixel sizes and pitches less than about 5 microns, it becomes difficult to control alignment and registration of each individual interconnect bump on the frontplane die to the corresponding interconnect bump on the backplane die.

At smaller pixel sizes and pitches, there is not much area to produce interconnect bumps. Thus, the interconnect bumps themselves typically are limited in size and shape, with not much space between adjacent bumps. A typical interconnect bump is gold with a rounded shape. If the bump is not very wide, head-to-head bonding of these bumps can be difficult. The two die containing the bumps may slip relative to each other, leading to misalignment of the bumps. This can cause a short circuit defect if a bump contacts an opposing bump from the neighboring pixel or an open circuit defect if slippage results in a space between two opposing bumps that should be contacting each other. Even if the proper electrical interconnection is made, slippage may result in a weaker mechanical bond if the two opposing bumps are bonded side-to-side rather than head-to-head.

These risks are multiplied as the number of pixels and corresponding head-to-head bonds increases and as the bump-to-bump pitch decreases. Thus, there is a need for better approaches to bonding.

BRIEF DESCRIPTION OF THE DRAWINGS

Embodiments of the disclosure have other advantages and features which will be more readily apparent from the following detailed description and the appended claims, when taken in conjunction with the examples in the accompanying drawings, in which:

DETAILED DESCRIPTION OF THE PREFERRED EMBODIMENTS

Figure 1A:
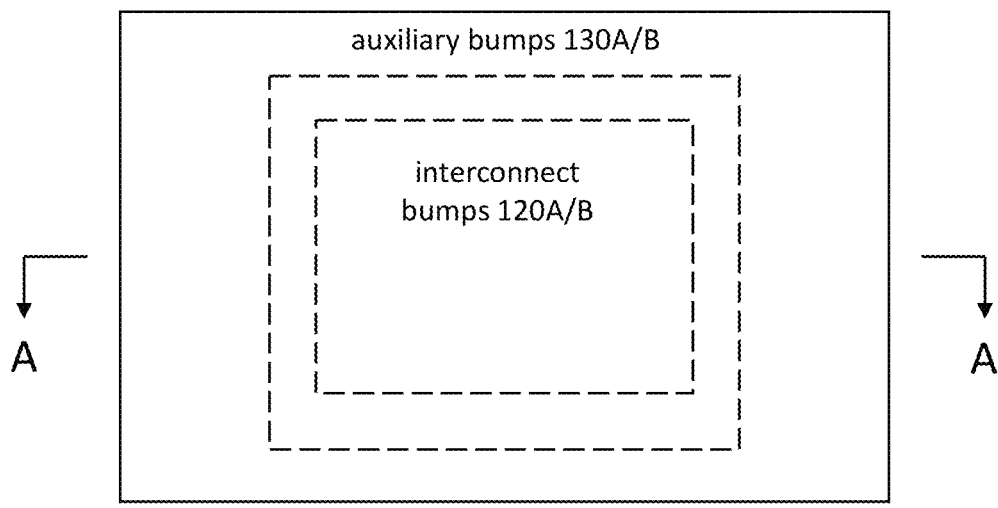
FIGS. 1A and 1B are a plan view and a cross-sectional view of a semiconductor device according to the present disclosure.

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

In one approach, additional bumps are used to reduce slippage of the die and stabilize alignment of the interconnect bumps during the bonding process. The shapes, positions and/or mechanical properties of these additional bumps are selected to "lock" the relative position of the two die and of the interconnect bumps, thus reducing or preventing any interconnect misalignment due to die slippage or rotation during the bonding process. For convenience, these additional bumps will be referred to as auxiliary bumps due to their role with respect to bonding the interconnect bumps. However, this does not imply that they cannot also serve as interconnects for other circuitry on the die.

In some embodiments, the auxiliary bumps and interconnect bumps are formed in the same process, and also bonded in the same process. That is, the process steps used to form the interconnect bumps on the LED frontplane also form the auxiliary bumps on the LED frontplane die, and the same is true for the interconnect bumps and auxiliary bumps on the backplane die. Corresponding bumps, both interconnect bumps and auxiliary bumps, are all bonded to each other in a single common bonding process. The auxiliary bumps stabilize the lateral position of the interconnect bumps during the bonding process. This approach reduces additional process steps. It also reduces the need for extra alignment steps. For example, if the interconnect bumps and auxiliary bumps are both formed using the same mask, then their relative spacing can be determined with high precision by their placement on the mask. However, if interconnect bumps are formed using one mask and auxiliary bumps using a different mask, then the masks must be carefully aligned to achieve the correct relative placement of the two types of bumps.

One example of auxiliary bumps are interdigitated bumps. Interdigitated bumps are more self-aligning and laterally stable because bumps do not meet head-to-head. Rather, the head of a bump on one die falls into the space between bumps on the other die, which constrains lateral movement of the bumps relative to each other. Thus, the interdigitated auxiliary bumps stabilize alignment of the interconnect bumps.

Another example of auxiliary bumps are nail bumps. In nail bumps, one bump is harder (the nail) and "drives" into the opposing softer bump during bonding. This constrains the lateral movement of the two bumps relative to each other and reduces lateral slippage. Again, dense arrays may not have enough space to use nail bumps for the interconnects themselves. Instead, additional nail bumps (the auxiliary bumps) are used to stabilize alignment of the interconnect bumps.

Figure 1B:
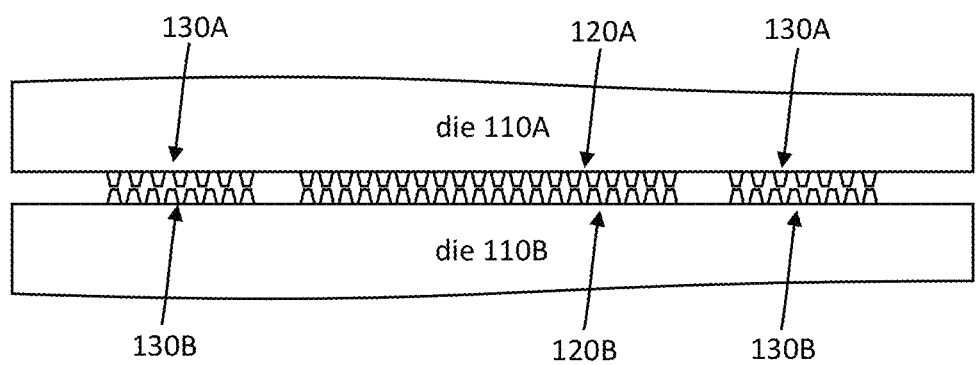

FIGS. 1A and 1B are a plan view and a cross-sectional view of a semiconductor device according to the present disclosure. The semiconductor device has two die 110A and 110B. The die 110A and 110B include interconnect bumps 120A and 120B, respectively. The interconnect bumps 120A/B are connected to circuitry on their respective die 110A/B, and the bonding of corresponding interconnect bumps 120A/B connects circuitry on one die 110A with circuitry on the other die 110B. The interconnect bumps 120A/B are located within the smaller dashed rectangle in the plan view of FIG. 1A. There is a dense array of interconnect bumps 120 on each die, and the interconnect bumps 120 are bonded head-to-head to each other, as described in more detail below.

The die 110A and 110B also include auxiliary bumps 130A and 130B, which in this example are located in the annular region around the interconnect bumps 120, as shown in the plan view of FIG. 1A. The auxiliary bumps 130 are also bonded to each other, but they may not be bonded head-to-head. The auxiliary bumps 130 are used to maintain alignment and prevent/reduce slippage of the interconnect bumps 120 during the bonding process.

FIG. 1B shows a cross-sectional view of the semiconductor device, through section A-A of FIG. 1A. The groupings of interconnect bumps 120 and auxiliary bumps 130 are different. The interconnect bumps 120 are densely packed in order to make interconnections between circuitry on the two die 110. For example, the interconnect bumps 120 may connect a dense array of circuitry on one die 110A to the corresponding dense array of circuitry on the other die 110B. As a result, the interconnect bumps 120 are relatively small and they are bonded head-to-head. For example, in dense arrays, the width of the interconnect bumps may occupy at least one third, or even one half or more, of the bump-to-bump pitch, leaving little room for error. The auxiliary bumps 130 may not have the same constraints. Thus, they may have different shapes (including different widths and/or heights), spacings and/or mechanical properties compared to the interconnect bumps 120. They also may not be bonded head-to-head, in order to provide lateral stability for bonding of the interconnect bumps 120.

Figure 2:
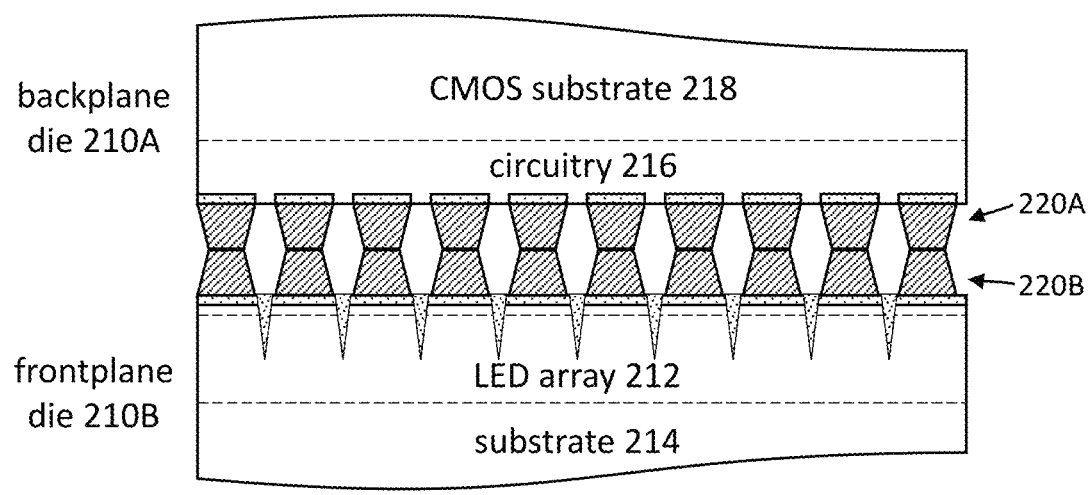
FIG. 2 shows a cross-sectional view of an example semiconductor device in more detail.

FIG. 2 shows a cross-sectional view of an example semiconductor device in more detail. In this example, the semiconductor device is a micro LED display. Only the portion with the interconnect bumps 220 is shown. The auxiliary bumps are not shown. One die, the "bottom" die in FIG. 2, is a frontplane die 210B that includes an LED array 212 supported on a substrate 214. The "top" die 210A includes an array 216 of corresponding pixel drivers supported on another substrate 218. The pixel drivers 216 drive the LEDs 212. For example, the LED array 212 may be GaN LEDs on a GaN substrate 214, while the pixel drivers are CMOS drivers 216 on a silicon substrate 218. The metal bumps 220B on the frontplane 210B are bonded head-to-head to corresponding metal bumps 220A on the backplane 210A. In this way, the LED array 212 may be connected to the corresponding pixel drivers 216 to form an image source.

Thermal compression bonding (TCB) flip chip processes may be used to bond the two die together. TCB processes can be used to achieve heterogeneous integration, whereby different types of die may be interconnected, for example logic and memory, logic and display, logic and power, and so on. In this example, the two die are LED and driver.

Figure 3:
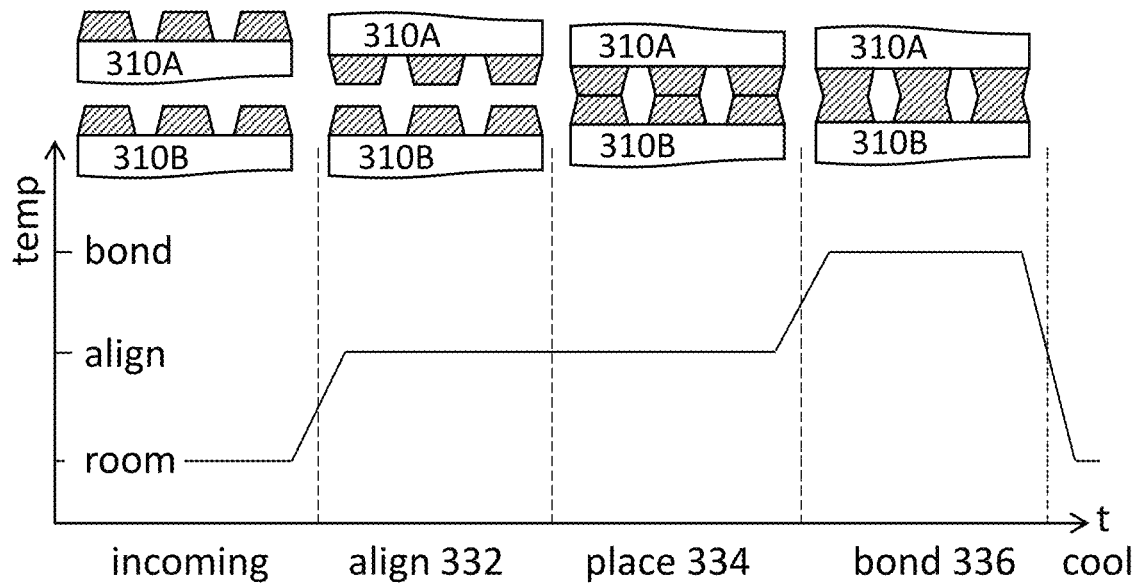
FIG. 3 is a diagram of a thermal compression bonding (TCB) flip chip process.

FIG. 3 is a diagram of a TCB flip chip process for bonding two die 310A and 310B. The TCB flip chip attach process involves flipping the "top" die 310A so that the bumps face down, and aligning 332 the top die 310A with the "bottom" die 310B which has the matching bumps facing up. Alignment may be performed at above room temperature (at the alignment temperature), to reduce the effect of different thermal coefficients of expansion for the two die 310. The two die 310A and 310B are brought into contact, which may be referred to as placement 334. Heat is applied on both die 310 under pressure (hence "thermal compression" bonding 336) to create a metallurgical bond between the bumps, resulting in a homogeneous metallurgical joint. During bonding 336, the bumps remain in the solid state and bond by solid state diffusion. The alignment temperature may be between about 100 to 160 degrees C., and the bonding temperature may be about 200 to 250 degrees C. or less than the melting point of the metals being bonded.

Because of the difference in thermal expansion coefficients of the two die as well as their surrounding tooling, the process steps 332-336 may be performed at as low a temperature as possible, so as to get the best alignment between the interconnect bumps. Lower temperatures for die placement and bonding lowers $\Delta T$, which is the temperature difference between room temperature and the peak process temperature. Thus, when a high alignment accuracy is desired, the metallurgical bonding may be conducted well below the melting point of the joining metals. Moreover, in some cases such as gold-gold inerconnect joints, due to high melting points (>1000 C) of the bonding metals such as gold, it is not practical to heat the joint all the way to the melting point of the metal. The only option to form a metallurgical joint then is via solid-state diffusion.

Another advantage of solid-state diffusion, besides lowering $\Delta T$ and thereby enabling high accuracy bonding, is to avoid complete melting of the interconnect bumps. Molten interconnect bumps are essentially like liquid balls or droplets of liquids with no strength. Thus, the neighboring molten bumps can easily bridge or merge, forming defects such as electrical shorts and missing metals. Solid state metal diffusion avoids such electrical shorts or other instabilities due to complete melting.

An important step in the flip chip attach process is to obtain and maintain perfect or near-perfect alignment of the bumps prior to joint formation. Bumps may be made from gold, and gold is slippery and can take some time to bond. Even a slight shift or rotation of the top die 310A relative to the bottom die 310B during or after placement 334, and prior to the joint formation 336, can result in interconnect misregistration or die misalignment. This can lead to defects, such as short circuits and open circuits, and mechanically weak bonds. After the joint has formed 336, assuming it is a strong joint, no further die misalignment is expected. If the bump-to-bump pitch is short, for example less than about 5 microns, obtaining acceptable interconnect alignment registration becomes even more difficult. Flip chip bonder tools are often designed to provide sub-micron die placement accuracy, but that only means that those tools assure accurate placement of the top die onto the bottom die. Any subsequent slippage or rotation of the die after placement, and prior to the joint formation, may not always be controllable by the tool.

Figure 4A:
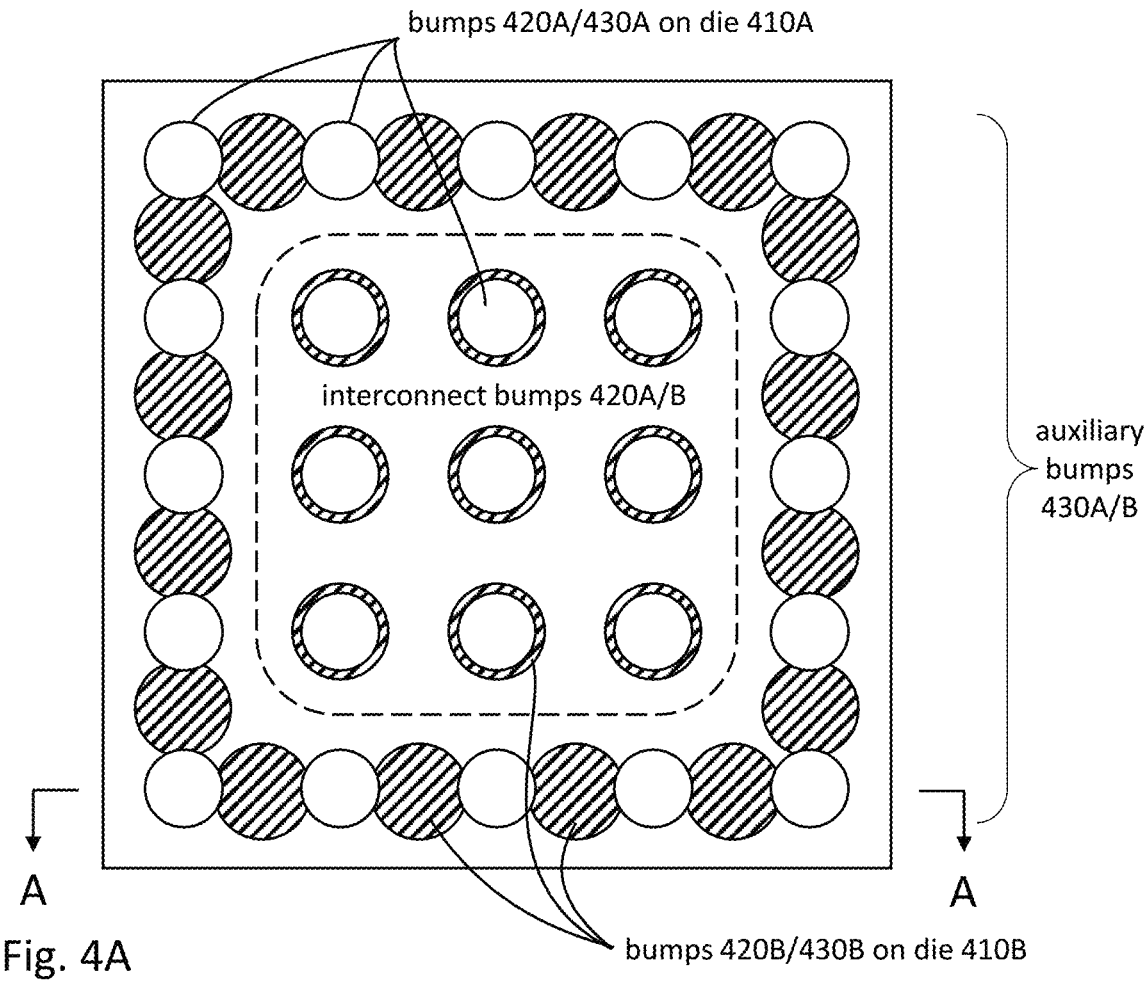
FIGS. 4A and 4B are a plan view and a cross-sectional view of a semiconductor device using interdigitated auxiliary bumps.
Figure 4B:
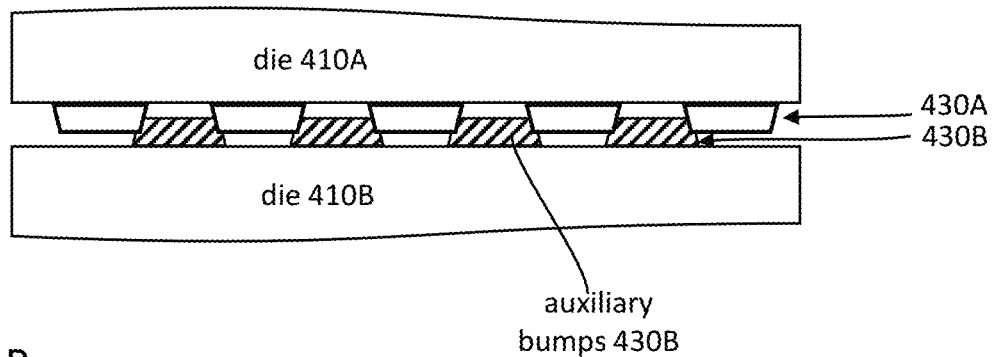

FIGS. 4A and 4B are a plan view and a cross-sectional view of a semiconductor device using interdigitated auxiliary bumps. In FIG. 4A, the bumps on the top die 410A are shown as white circles and the bumps on the bottom die 410B are cross-hatched circles. The 3×3 array of bumps within the dashed line are the interconnect bumps 420 and the ring of bumps around the perimeter are the auxiliary bumps 430. FIG. 4B shows a cross-sectional view of the semiconductor device, through section A-A of FIG. 4A.

The design and placement of bumps can influence die movement during or after die placement and prior to joint formation. In a head-to-head configuration as shown in FIG. 2 or 3, corresponding bumps on the two die are aligned opposite each other. During placement, the centers of the two opposing bumps make direct contact. The bumps may plastically deform as heat and pressure are applied during bonding. If head-to-head alignment is maintained throughout the bonding process, the resulting bond will have electrical and mechanical integrity due to the head-to-head alignment during bonding. However, die slippage or movement during or after placement may result in a "cheek to cheek" alignment where opposing bumps are offset relative to each other. This forms a joint with bumps 430 that alternate between top and bottom die, as shown in FIG. 4B. These are interdigitated bumps. This is not a desired configuration for interconnect bumps, as it can result in electrical shorts. Yet at the same time, it is also an equilibrium low energy configuration that the system tends to reach, in the event of a disturbance, as shown in FIG. 4B. Small movements may not move the die further from this state. Thus, the two die may remain "locked" in this configuration.

In FIG. 4B, the configuration of auxiliary bumps 430A/B leverages the natural tendency of a die-on-die system to reach the interdigitated equilibrium state. The auxiliary bumps 430A/B are intentionally not aligned so that the interdigitated auxiliary bumps lock the two die 410A/B into their relative positions and stabilize the head-to-head interconnect bumps 420A/B during bonding. The auxiliary bumps 430A/B may not be connected to any circuitry, for example if they are used only to stabilize the interconnect bumps during bonding. Alternatively, the auxiliary bumps 430A/B may also be interconnects in their own right.

In the example of FIG. 4, the spacing between bumps is approximately the same on die 410A and die 410B. The placement of bumps on the two die is designed such that the interconnect bumps 420A/B make head-to-head contact in the active region of the overall structure. In the interdigitated area or locking region, the auxiliary bumps 430B on die 410B are displaced one half period so that they fall between the corresponding bumps 430A on die 410A.

This technique may be applied not only to display-logic heterogeneous integration but also to any other high-density interconnect attach scenarios involving fine pitches, e.g. less than about 5 microns or even less than about 3 microns. For such fine pitch arrays, the head-to-head alignment of opposing bumps may have a tolerance for average misalignment of not more than 500 nanometers or less, and a tolerance of a third or less of the bump width. The auxiliary bumps may be added outside the active area of the die to provide die locking based on interdigitated auxiliary bumps. The auxiliary bumps may serve only as mechanical anchoring points and may be electrically isolated from the rest of the circuitry.

Figure 5A:
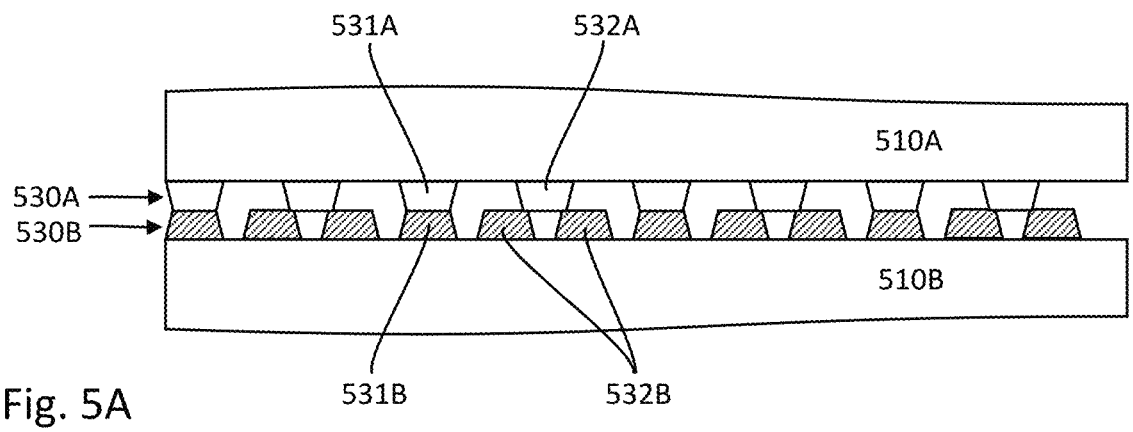
FIG. 5A is a cross-sectional view of another embodiment using non-aligned auxiliary bumps.

FIG. 5A is a cross-sectional view of another embodiment using intentionally non-aligned auxiliary bumps. In this example, there are 2 auxiliary bumps 530A on the top die 510A for every 3 auxiliary bumps 530B on the bottom die 510B. As a result, the auxiliary bumps alternate between head-to-head and interdigitated. Bumps 531A and 531B are aligned head-to-head, while bumps 532A and 532B are interdigitated.

Figure 5B:
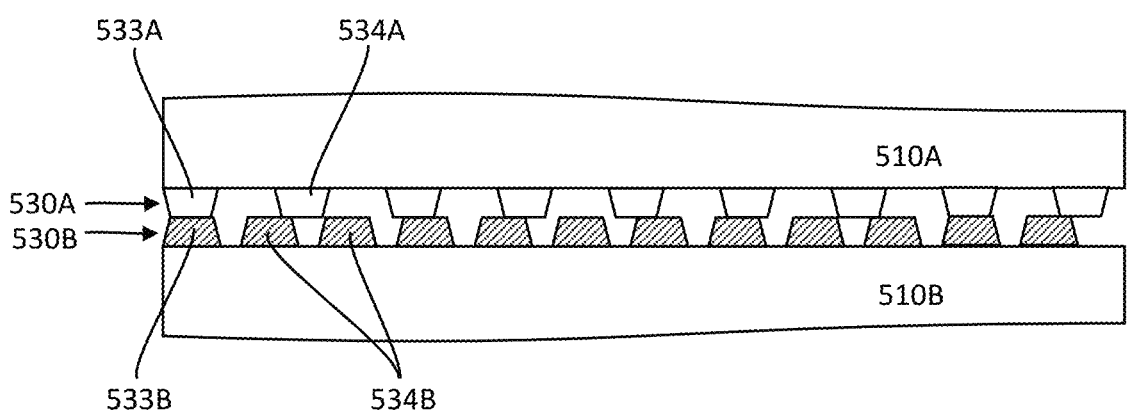
FIG. 5B is a cross-sectional view of yet another embodiment using non-aligned auxiliary bumps.
Figure 5C:
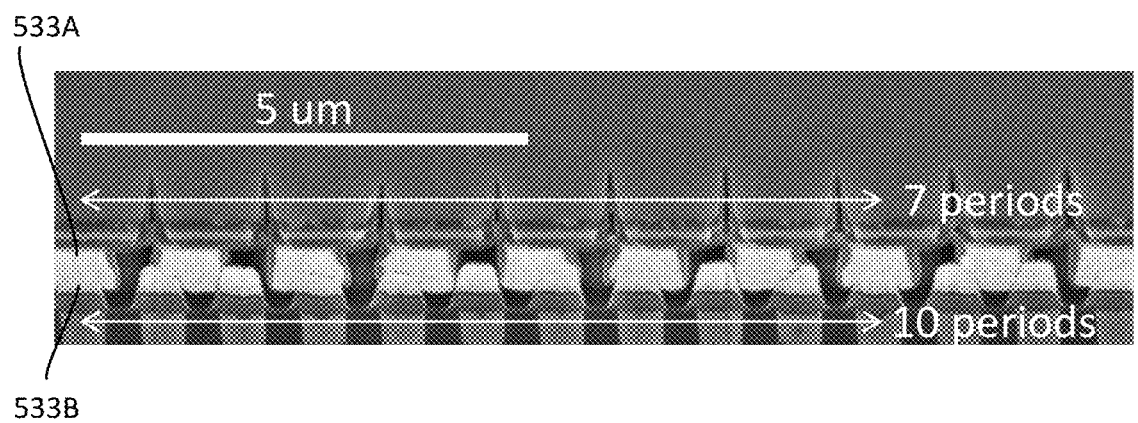
FIGS. 5C and 5D are scanning electron microscope (SEM) images of fabricated auxiliary bumps.
Figure 5D:
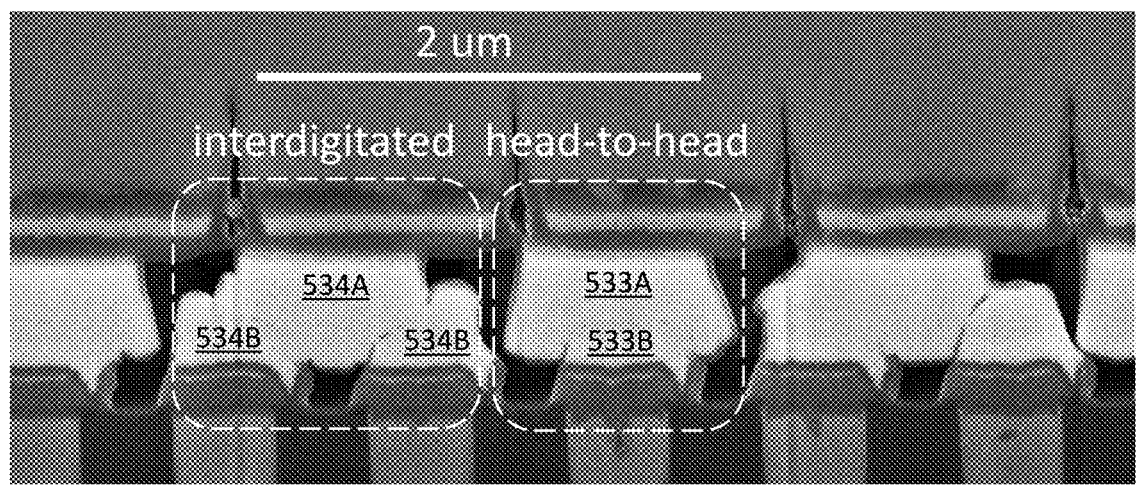

FIG. 5B is a cross-sectional view of yet another embodiment using intentionally non-aligned auxiliary bumps. In this case, the spacing between bumps is different between the two die. The top die 510A contains 7 auxiliary bumps 530A for every 10 auxiliary bumps 530B on the bottom die 510B. Opposing bumps are not strictly interdigitated, but they are offset by different amounts. Bumps 533A and 533B are aligned head-to-head. Bumps 534A and 534B are not offset by exactly half a period, but they still function as interdigitated bumps because the bumps deform plastically during bonding. FIGS. 5C and 5D are scanning electron microscope (SEM) images of the fabricated auxiliary bumps. A 5 micron and 2 micron scale is shown in FIGS. 5C and 5D, respectively. The aligned bumps 533A and 533B are marked in both SEM images. The top bumps 533A have a bump-to-bump pitch and are also larger in size, both in width and in height, than the bottom bumps 533B. FIG. 5D is a close-up of one section of FIG. 5C, showing both the head-to-head bumps 533A/B and the offset bumps 534A/B. The plastic deformation of the bumps can be seen in FIG. 5D.

Figure 6:
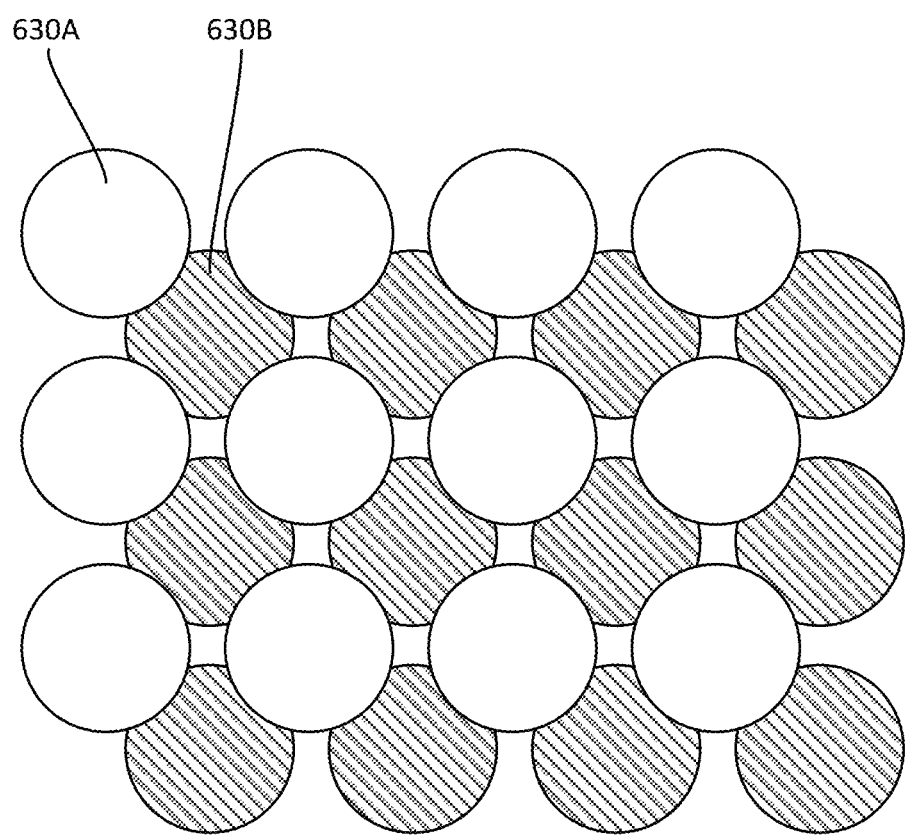
FIGS. 6-8 are plan views of embodiments using unaligned auxiliary bumps.
Figure 7:
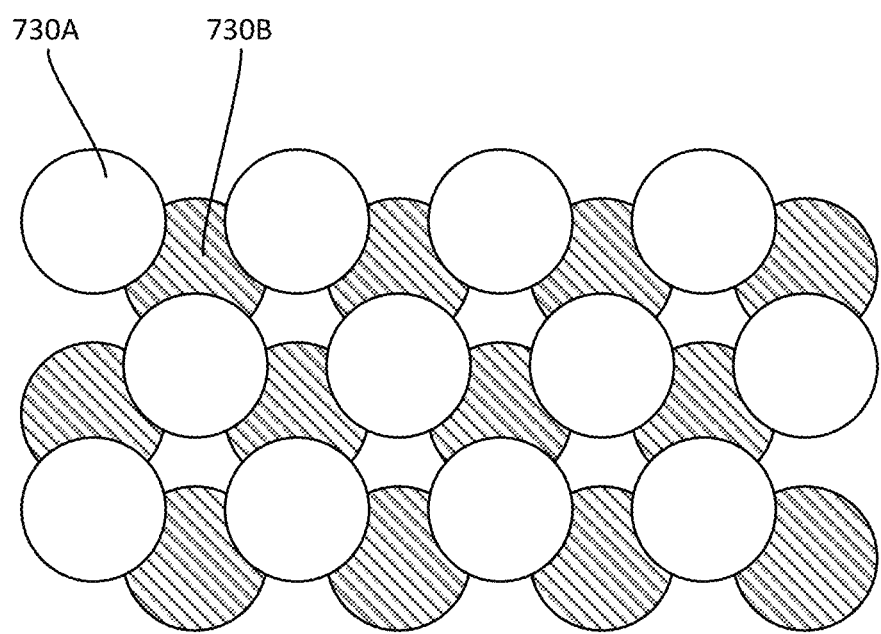
Figure 8:
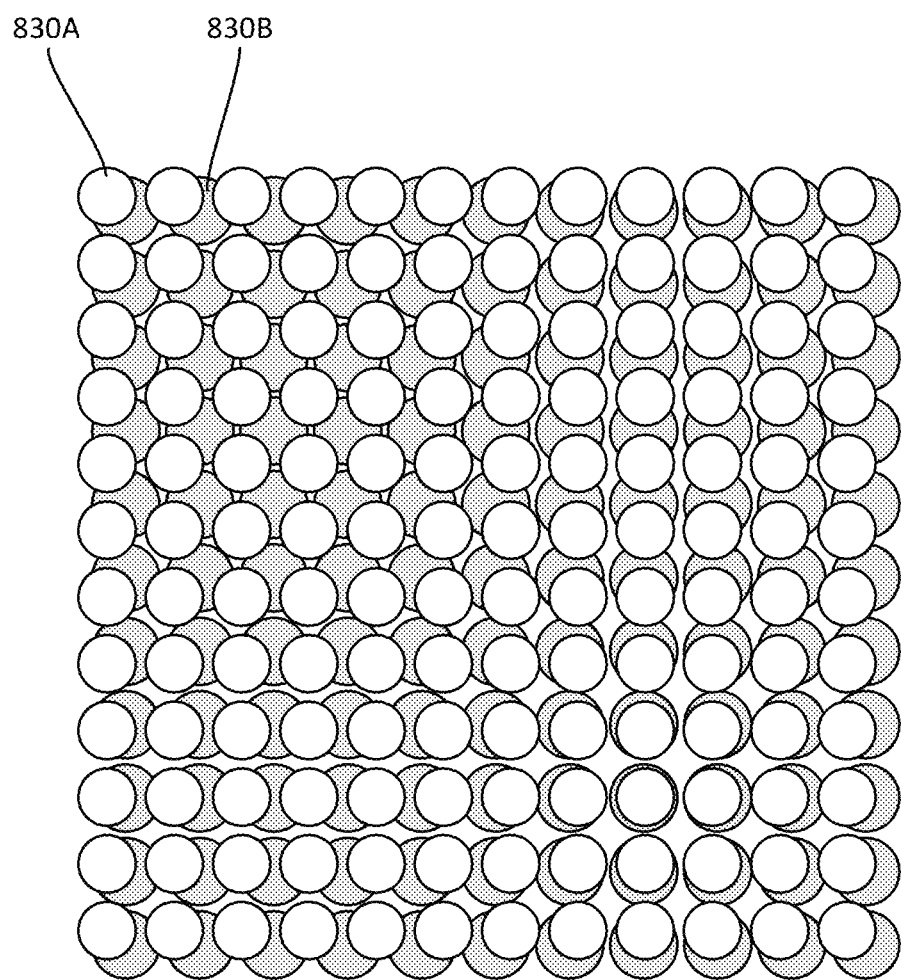

FIGS. 5A-5D showed cross-sectional views of different embodiments. FIGS. 6-8 are plan views of embodiments using auxiliary bumps. In FIG. 6, the auxiliary bumps 630A and 630B are interdigitated along two dimensions, rather than just one dimension. In FIG. 7, the auxiliary bumps 730A and 730B are interdigitated along two dimensions but using a triangular packing rather than a square packing. In this case, each bump 730 potentially contacts three bumps on the other die, rather than four, on the basis that three contacts is the minimum to define a bump's spatial position. In FIG. 8, the auxiliary bumps 830A and 830B are both two dimensional arrays, but the arrays have different bump-to-bump pitches. This is the approach shown in FIG. 5B implemented in two dimensions.

Still other approaches are possible in which dense head-to-head interconnect bumps bond two die in regions where the dies communicate via electrical signals and auxiliary bumps bond the two die in other regions to provide additional mechanical stability. The auxiliary bumps may help improve the alignment of the head-to-head contacts. In some cases, substantially all of the auxiliary bumps are non-aligned. In other cases, the auxiliary bumps may be only periodically non-aligned. In other cases, the auxiliary bumps may be only sparsely non-aligned. In yet another alternative, the auxiliary bumps may be pseudo randomly placed, resulting in different (pseudo-random) amounts of non-alignment.

Figure 9A:
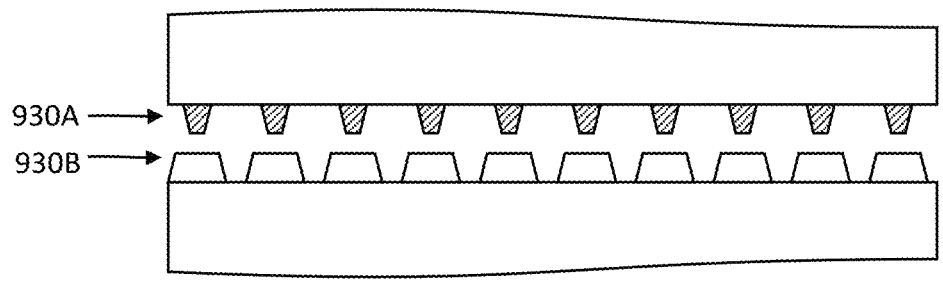
FIGS. 9A and 9B are cross-sectional views of an embodiment using nail bumps.
Figure 9B:
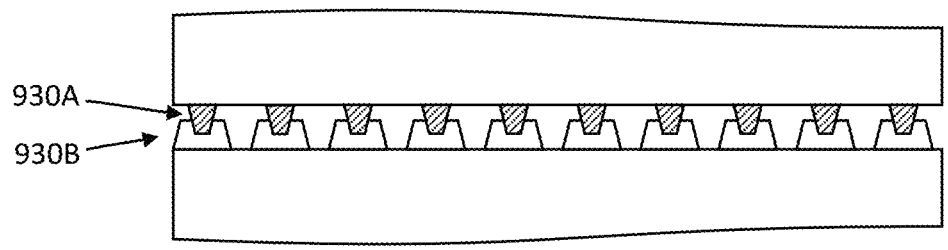
Figure 9C:
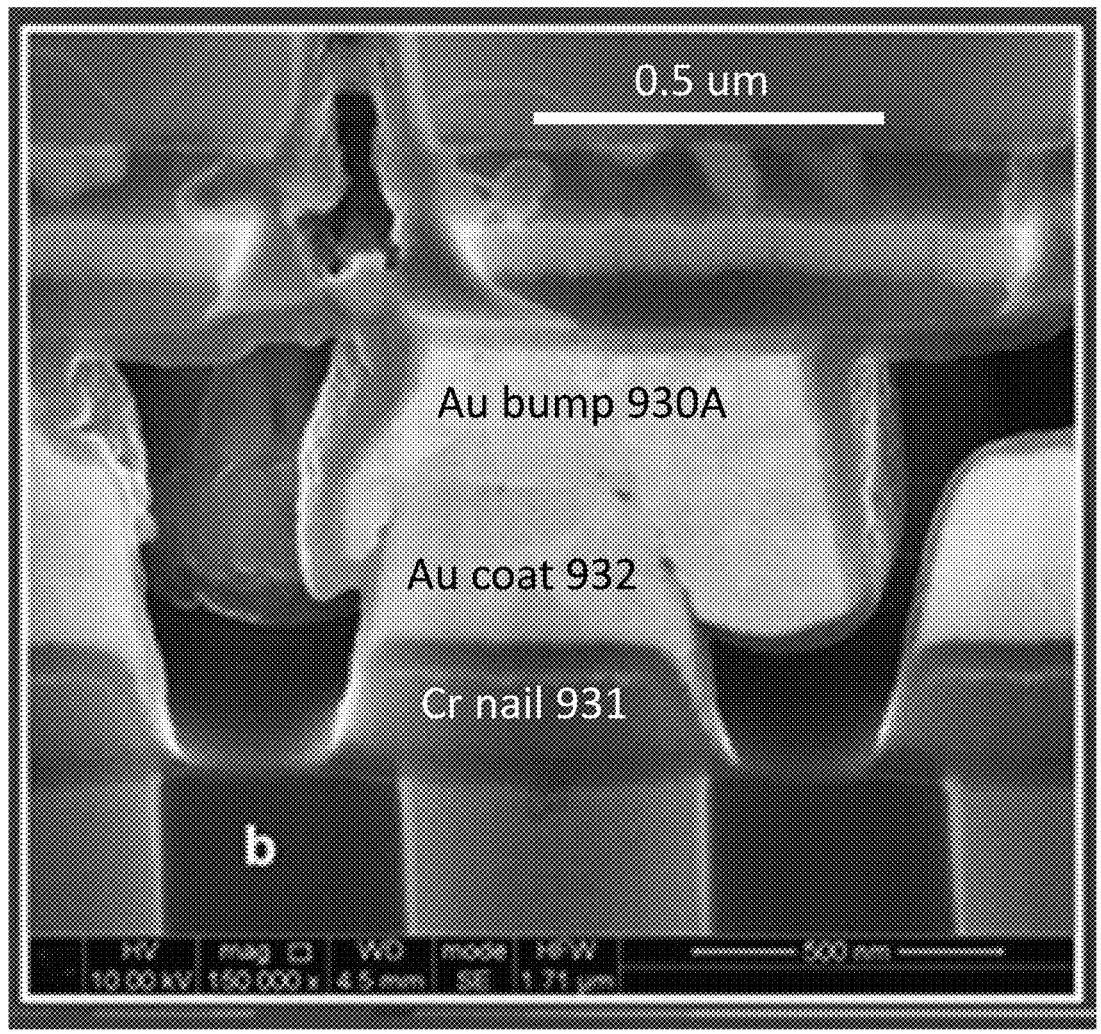
FIG. 9C is an SEM image of fabricated nail bumps.

Other approaches may also be used to achieve alignment stability. FIGS. 9A and 9B are cross-sectional views of an embodiment using nail bumps. FIG. 9C is an SEM image of fabricated nail bumps. In this approach, one of the auxiliary bumps 930A is made from a hard material in the shape of a "nail," while the opposing auxiliary bump 930B is flatter and made of a softer material, as shown in FIG. 9A. During bonding, this configuration provides a "stick-in-the-sand" type of joint as shown in FIG. 9B. This may prevent or reduce die slippage during die attach. The nail materials may be metals harder than gold, such as chromium, titanium, tungsten, cobalt and so on, although the nail bumps may be coated with gold. The soft metal may be gold, tin, silver, tin-silver alloys, indium and so on.

FIG. 9C shows an example of a nail bump 931/932 on one die piercing into a soft bump 930A on the other die. In this case, the bottom nail bump is based on a hard chromium nail 931, coated with a conformal layer of gold 932 that bonds to a flat gold bump 930A on the top die. The top softer bump 930A wraps around the bottom harder bump. The joint is gold to gold, but because of the underlying hard chromium nail 931, the two bumps are plastically deformed in a manner that reduces their lateral slippage.

FIGS. 10A-10F are cross-sectional diagrams illustrating a process for forming interconnect and auxiliary bumps for a die containing an LED array. Each figure shows a partially processed die, where the left side of the figure shows an area of the die with interconnect bumps and the right side shows an area with auxiliary bumps. In this example, the interconnect bumps connect to LEDs so, for convenience, the area with the interconnect bumps is referred to as the active area 1025. The auxiliary bumps are used to stabilize positioning of the interconnect bumps during bonding but do not provide the pixel-level connections to the LEDs so, for convenience, the area with the auxiliary bumps is referred to as the inactive area 1035. "Inactive area" is merely a label used for convenience to refer to the area with the auxiliary bumps. It does not imply that the auxiliary bumps themselves must be inactive or located in an area without other circuitry.

Figure 10A:
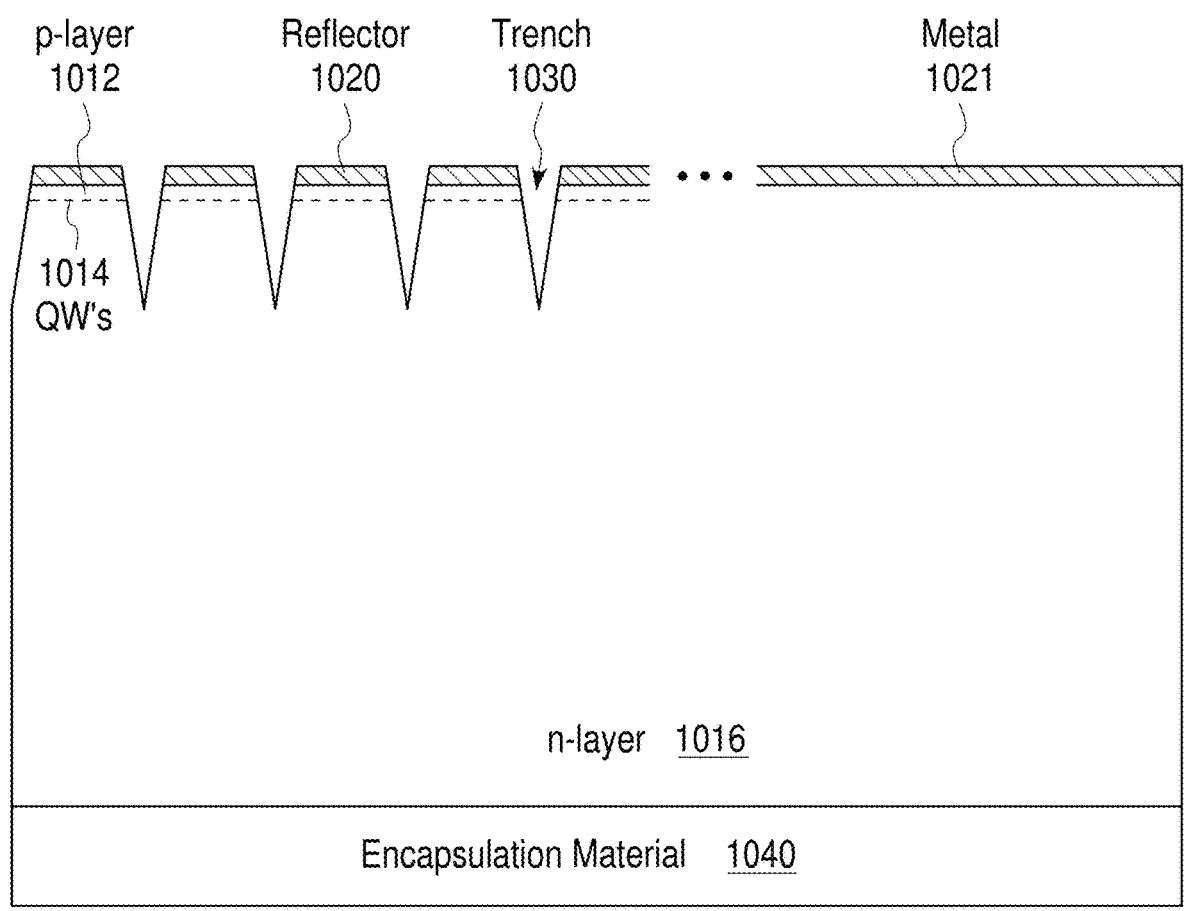
FIGS. 10A-10F are cross-sectional diagrams illustrating a process for forming interconnect bumps and auxiliary bumps for an LED array.

In FIG. 10A, the wafer has been processed to the point where the active area 1025 contains a basic LED stack: reflector 1020, thinner p-layer 1012, quantum well active region 1014, and thicker n-layer 1016. Adjacent LEDs in the array are separated by trenches 1030. Example processes for fabricating LED stacks are described in U.S. patent application Ser. No. 16/695,046, "Ultra-dense Arrays of LEDS with Half Cavities and Reflective Sidewalls, and Manufacturing Methods", which is incorporated herein by reference. The inactive area 1035 does not contain any of the LED structure. It contains only the metal layer 1021 which was also used to form reflector 1020, so as to maintain the two areas 1025, 1035 at the same height.

Figure 10B:
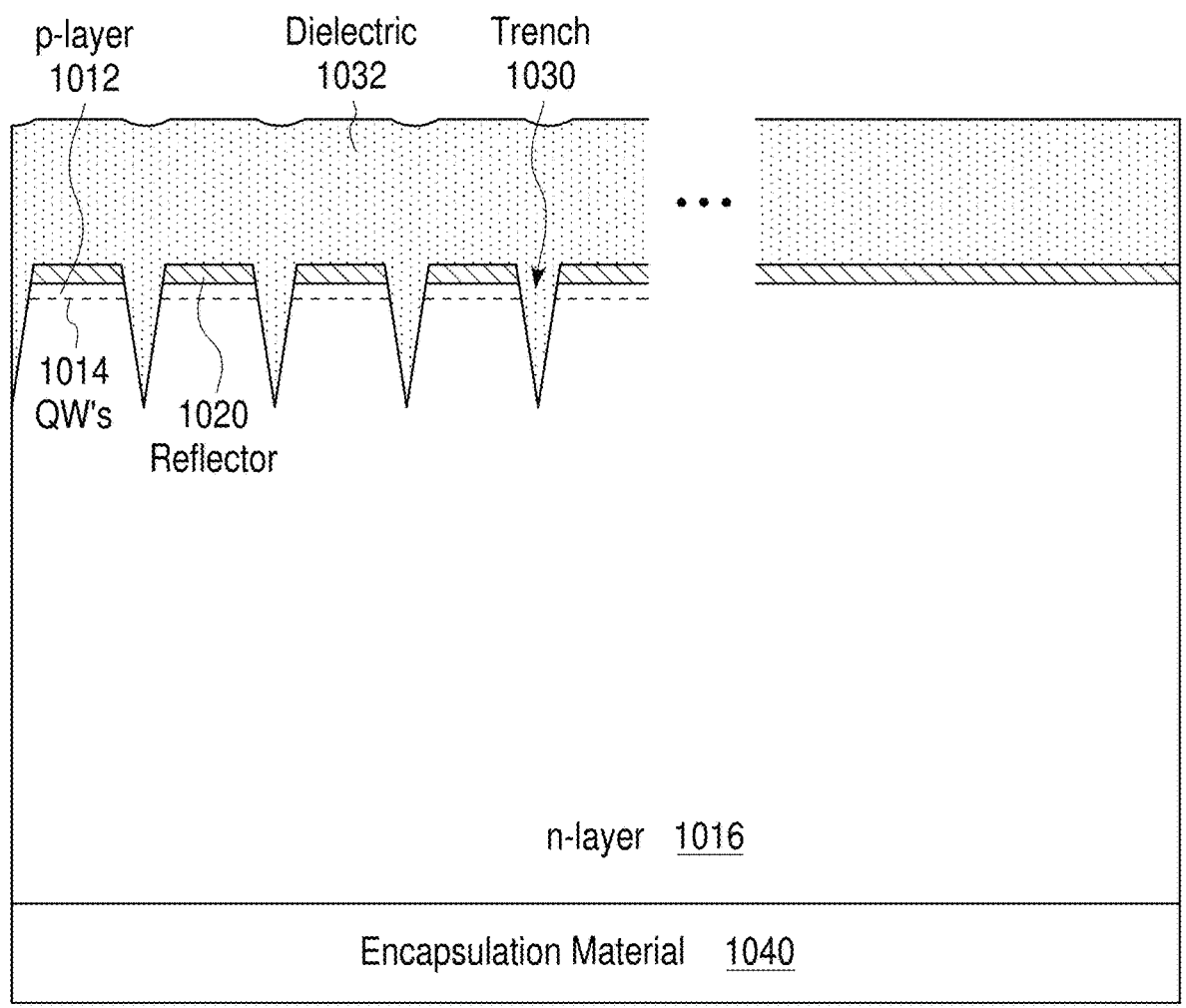

In FIG. 10B, dielectric 1032 is deposited on the wafer, filling the trenches 1030 in the active area 1025. Alternatively, a dielectric 1032 may partially fill the trenches, with an absorptive material deposited after the dielectric. Examples of dielectric 1032 include $SiO_2$, $Si_3N_4$, $Al_2O_3$, benzocyclobutene (BCB), spin-on glass, and polyimide. Because of the high aspect ratios involved, the top surface of the dielectric 1032 in the active area 1025 may exhibit some topology. The dielectric 1032 is also deposited over the inactive area 1035.

Figure 10C:
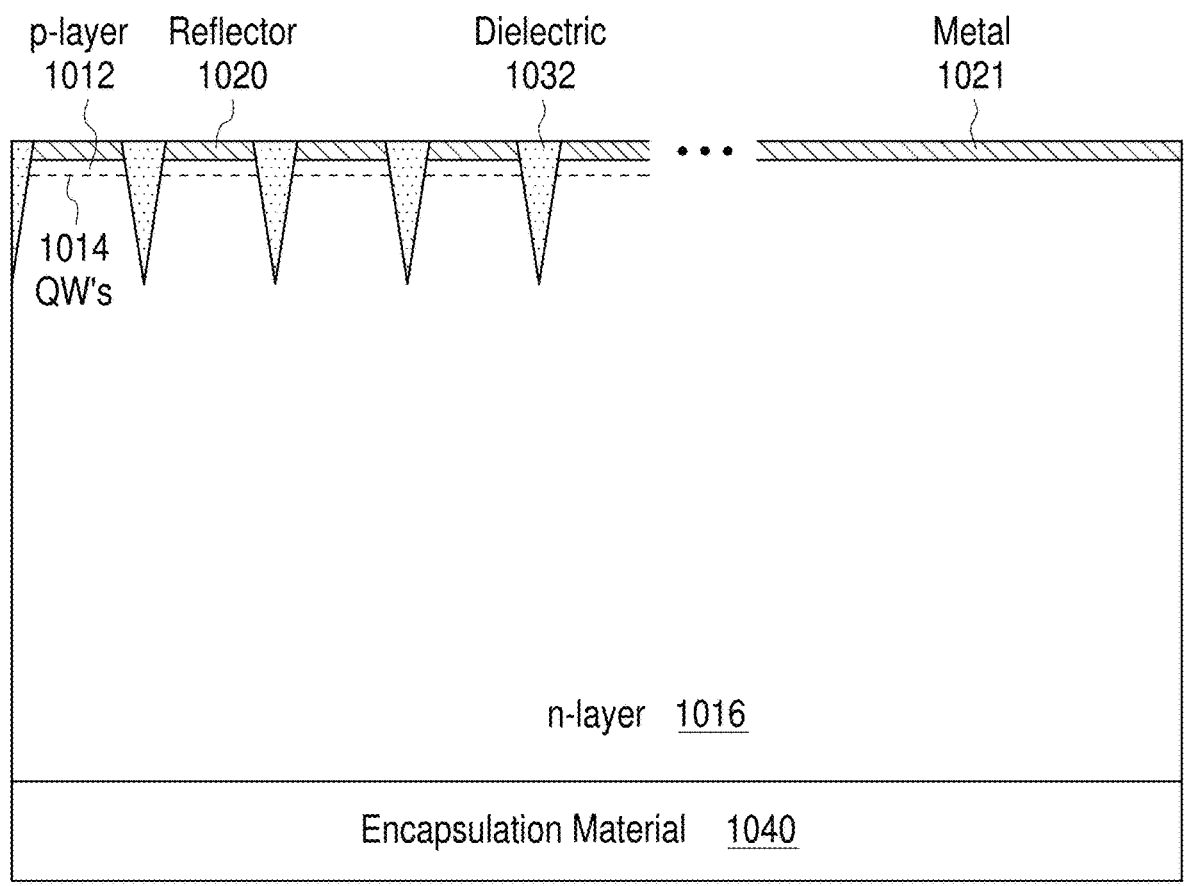

In FIG. 10C, the top surface is planarized, for example by chemical mechanical polishing. This forms a flat surface with both the reflector/metal layer 1020/1021 and adjacent dielectric 1032. In some cases, the surface flatness is 200 nm or better. In alternative approach, the planarized surface may be produced by depositing BCB in FIG. 10B and then etching back with a dry etch.

Figure 10D:
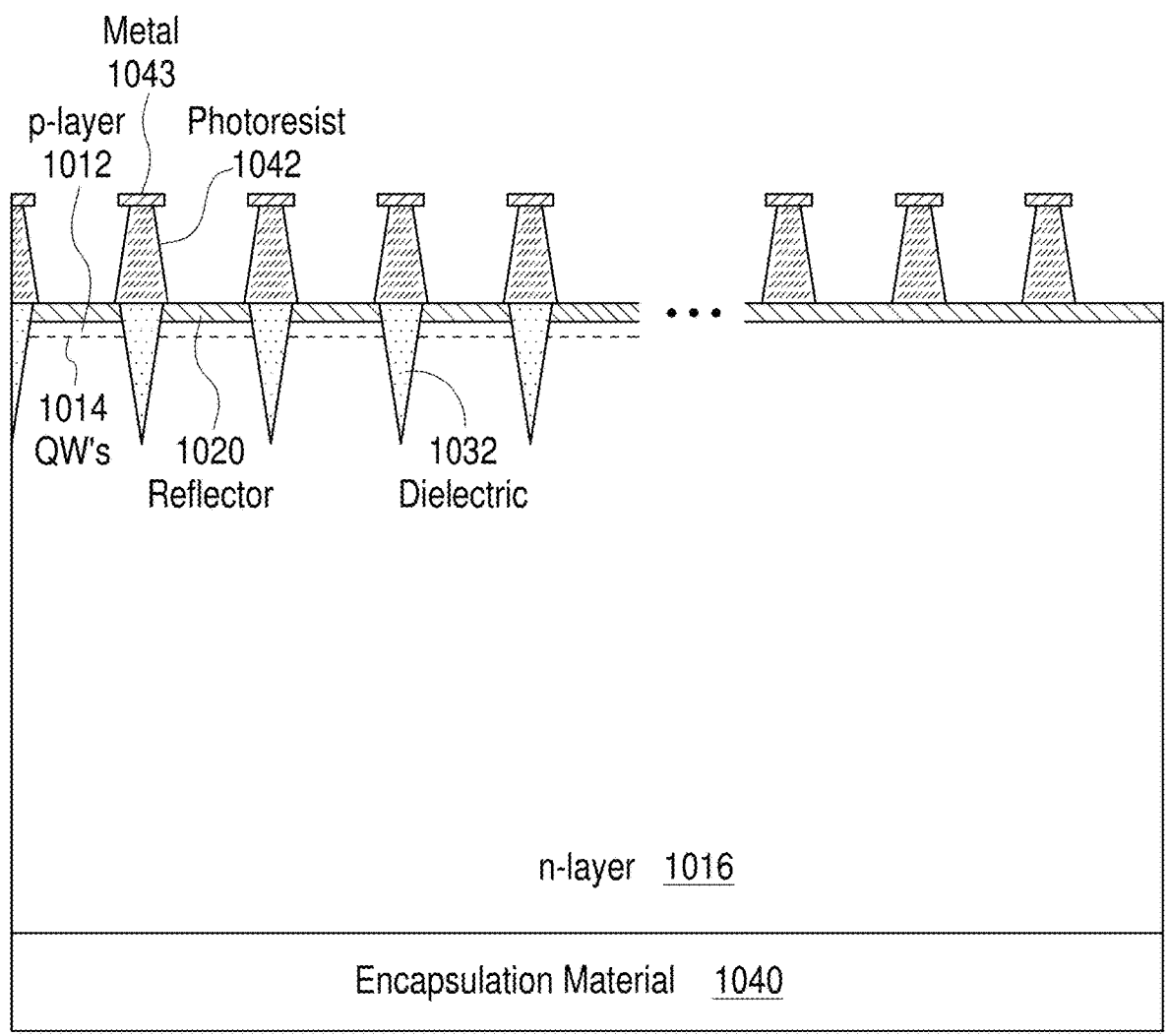
Figure 10E:
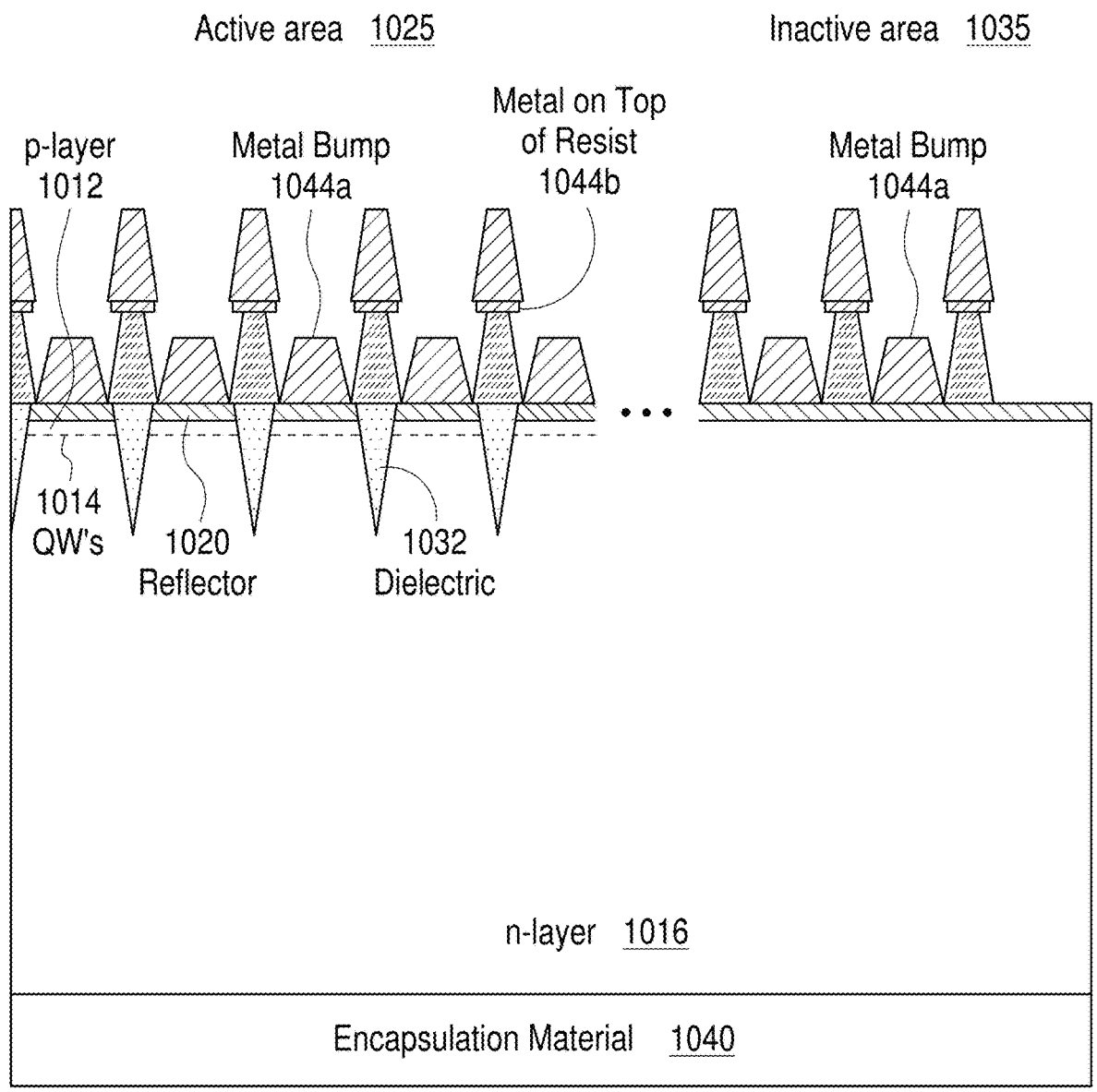
Figure 10F:
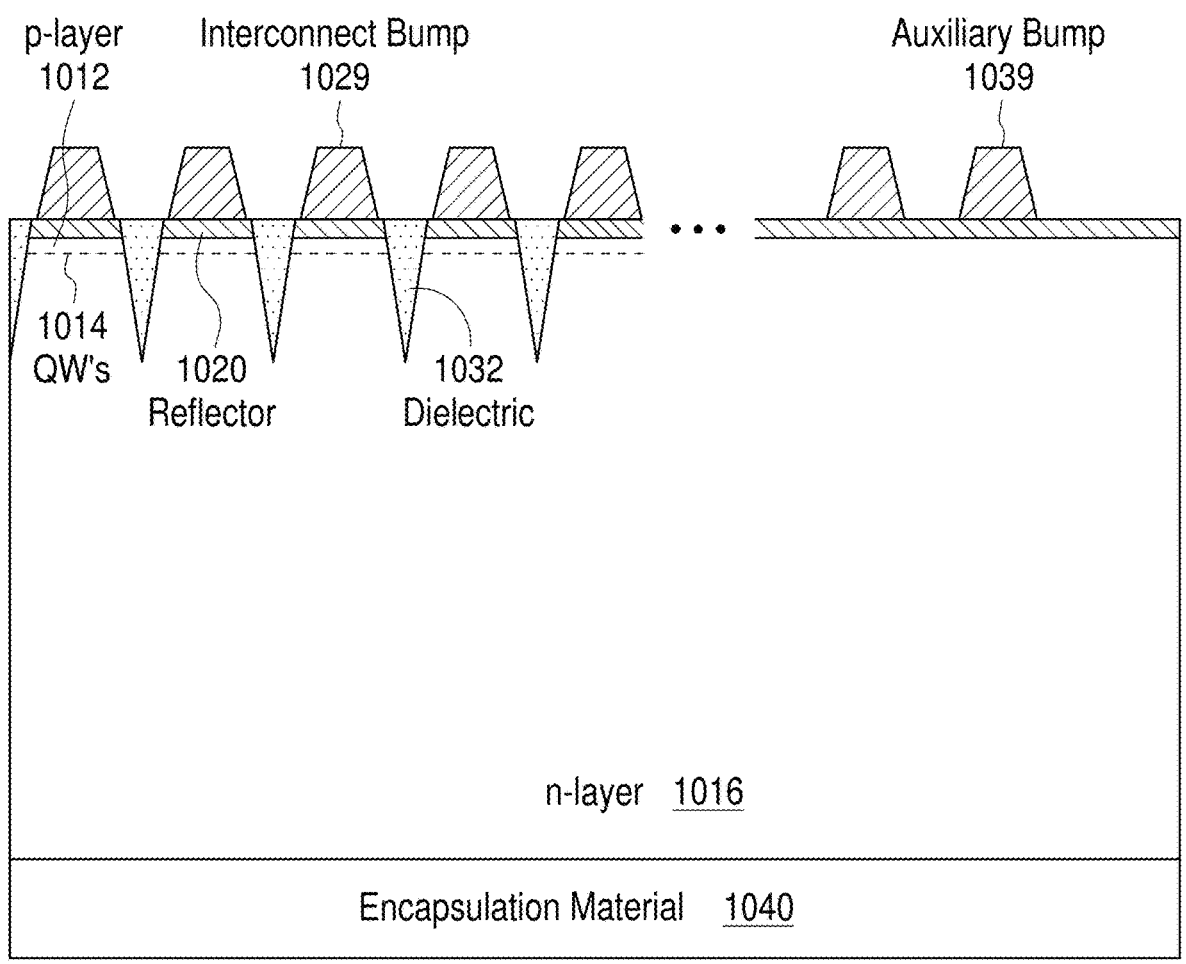

In FIGS. 10D-10F, metal contacts (bumps) to the reflector layer 1020 are formed. Because these LED pixels are so small, it can be difficult to form metal contacts on the reflector layer 1020 alone, if the adjacent flat dielectric 1032 were not also present.

In FIGS. 10D-10F, the metal contacts are formed using a liftoff process. In FIG. 10D, a photoresist structure 1042 is deposited on the flat surface and then patterned. In the active area 1025, the dielectric 1032 is covered by the photoresist structure 1042, but the reflector layer 1020 is exposed. In the inactive area 1035, the photoresist structure 1042 is patterned to create auxiliary bumps of the right size and shape at the right positions. In FIG. 10D, the photoresist structure 1042 is topped by a hard mask 1043 such as metal or oxide. In FIG. 10E, a metal layer 1044a,b is deposited on this structure 1042-1043. The metal layer 1044a deposited on the reflectors 1020 will become the interconnect bumps to the LEDs and the metal layer 1044a deposited on the metal layer 1021 will become the auxiliary bumps. The metal layer 1044b deposited on the photoresist structure 1042-1043 will be removed by liftoff. The resulting interconnect bumps 1029 and auxiliary bumps 1039 are shown in FIG. 10F. An alternative to the liftoff process is metal deposition by electroplating, followed by a metal etch.

Planarizing the reflector 1020 and dielectric 1032 together creates a larger flat surface on which to deposit the photoresist 1042 and metal 1044 structures. For example, in FIG. 10D, the photoresist ridges 1042 are supported by the dielectric 1032 and reflector 1020. The ridges are tall and skinny (high aspect ratio) and would be difficult to create over topography. Planarizing the dielectric 1032 and reflector 1020 creates a flat surface for these high aspect ratio features. The same is true for the metal deposition and liftoff. For example, the photoresist ridges 1042 may have a width of between 0.1 um to 0.5 um and a height of 1 um to 2 um. The metal contacts 1045 may have a width of between 0.4 um to 2 um and a height of 1 um to 2 um. The aspect ratios (height to width) of these features may be 2:1 or higher.

The techniques described above may be used to connect LED arrays on one substrate to arrays of pixel drivers which may be CMOS circuits on another substrate. This bonding may be done at a wafer-wafer level, in which a wafer with multiple LED arrays is bonded to a wafer with multiple corresponding arrays of pixel drivers. Alternatively, it may be done at a die-die level, in which a single die with LEDs is bonded to a die with corresponding pixel drivers. It may also be done at a wafer-die level, in which individual singulated die are bonded to die still in wafer form. For example, a GaN wafer may be singulated into die of LED arrays, which are then bonded one die at a time to a corresponding driver array on a CMOS wafer.

Figure 11:
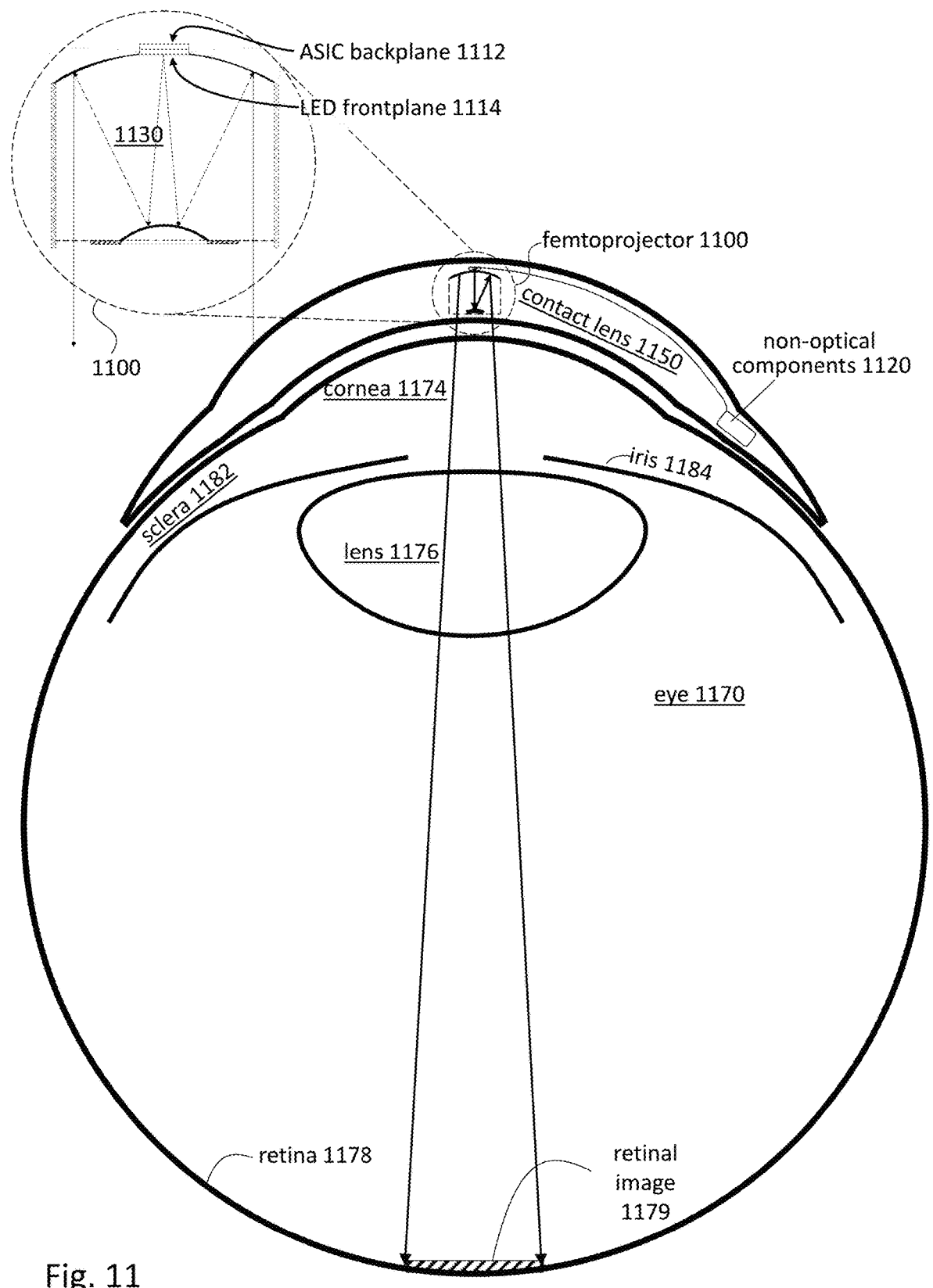
FIG. 11 shows a cross sectional view of an eye-mounted display containing a femtoprojector in a contact lens.

One possible use of a monolithic ultra-dense LED array as described above is as the image source in a contact lens-based display so that the displayed image overlays (or replaces) the wearer's view of the real world. FIG. 11 shows a cross sectional view of an eye-mounted display containing a small projector (femtoprojector) 1100 in a contact lens 1150.

FIG. 11 shows an embodiment using a scleral contact lens which may be designed so that it does not move relative to the eyeball, but the contact lens does not have to be scleral. The aqueous of the eyeball is located between the cornea 1174 and the crystalline lens 1176 of the eye. The vitreous fills most of the eyeball including the volume between the crystalline lens 1176 and the retina 1178. The iris 1184 limits the aperture of the eye.

The contact lens 1150 preferably has a thickness that is less than two mm, and the femtoprojector 1100 preferably fits in a 2 mm by 2 mm by 2 mm or smaller volume. The contact lens 1150 is comfortable to wear and maintains eye health by permitting oxygen to reach the cornea 1174. The femtoprojector 1100 includes an image source 1112/1114 and projection optics 1130. The image source includes a backplane 1112 and a frontplane 1114, examples of which have been described above. In this example, the backplane 1112 is a CMOS application specific integrated circuit (ASIC) containing pixel drivers and the frontplane 1114 includes a GaN LED array. The backplane electronics 1112 receive data packets from a source external to the eye-mounted display. The backplane ASIC 1112 converts the data packets to drive currents for the frontplane GaN LED array 1114, which produces light that is projected by the optical system 1130 to the user's retina 1178.

In some designs, the optical system 1130 is a two mirror system. For example, see U.S. Pat. No. 10,712,564 "Advanced Optical Designs for Eye-Mounted Imaging Systems" and U.S. Pat. No. 10,353,204 "Femtoprojector Optical Systems," which are all incorporated by reference in their entireties. These optical systems 1130 are small enough to fit into a contact lens and may be small enough to fit into a 2 mm×2 mm×2 mm volume, or even into a 1 mm×1 mm×1 mm volume. These designs may have a collection angle of 10 degrees to 40 degrees (5 to 20 degrees half angle), as measured in air. The collection angle will be reduced correspondingly, if measured in a medium with a higher refractive index.

The array of light emitters 1114 may have non-uniform resolution. For example, the central area of the array may be imaged onto the fovea and therefore the center pixels have higher resolution (i.e., smaller pitch between pixels) compared to pixels on the periphery of the array. The pitches of the frontplane 1112 and backplane 1114 may be matched, in which case there is less area for each pixel driver in the center of the backplane compared to the periphery. Alternately, the backplane 1114 may have a uniform pitch, where the frontplane 1112 still has a variable pitch. In one approach, a wiring layer bridges between the uniform pitch backplane 1114 and variable pitch frontplane 1112. By using different wiring layers, the same backplane may be used with different frontplanes.

Eye-mounted femtoprojector displays may use a 200×200 array of color pixels. The display may be monochromatic or color. A three-color display with three LEDs per color pixel may have a total of at least 120,000 LEDs.

Another possible use of the monolithic ultra-dense LED display is in eyewear, such as glasses or goggles, to create an immersive visual experience or an image that overlays the wearer's view of the real world, such as in an augmented, mixed, or artificial reality application.

Although the detailed description contains many specifics, these should not be construed as limiting the scope of the invention but merely as illustrating different examples. It should be appreciated that the scope of the disclosure includes other embodiments not discussed in detail above. Various other modifications, changes and variations which will be apparent to those skilled in the art may be made in the arrangement, operation and details of the method and apparatus disclosed herein without departing from the spirit and scope as defined in the appended claims. Therefore, the scope of the invention should be determined by the appended claims and their legal equivalents.

What is claimed is:

1. A semiconductor device comprising:
    a first die comprising first bumps, the first bumps comprising first interconnect bumps connected to circuitry on the first die and further comprising first auxiliary bumps; and
    a second die comprising second bumps, the second bumps comprising second interconnect bumps connected to circuitry on the second die and further comprising second auxiliary bumps;
    wherein the first and second interconnect bumps are bonded head-to-head to each other, thereby forming interconnects between the circuitry on the two die; and the first and second auxiliary bumps are also bonded to each other, at least some of the first and second auxiliary bumps are not aligned head-to-head and the non-aligned auxiliary bumps are interdigitated, and at least some others of the first and second auxiliary bumps are aligned and bonded head-to-head to each other.

2. The semiconductor device of claim 1 wherein the auxiliary bumps are configured to reduce misalignment of the interconnect bumps during bonding.

3. The semiconductor device of claim 1 wherein, among the non-aligned auxiliary bumps, the first auxiliary bumps are a different size than the second auxiliary bumps.

4. The semiconductor device of claim 1 wherein the first interconnect bumps comprise an array that connects to an array of circuitry on the first die, and the second interconnect bumps comprise an array that connects to an array of circuitry on the second die.

5. The semiconductor device of claim 4 wherein each of the arrays of first and second interconnect bumps has a bump-to-bump pitch of not more than 5 microns, and the first and second interconnect bumps each have an average width that is at least one third of a bump-to-bump pitch.

6. The semiconductor device of claim 4 wherein the first and second auxiliary bumps are positioned around a perimeter of the arrays of first and second interconnect bumps, respectively; and a bump-to-bump spacing of the first and second auxiliary bumps is larger than a bump-to-bump pitch of the first and second interconnect bumps, respectively.

7. The semiconductor device of claim 1 wherein at least some of the first and second auxiliary bumps are also connected to circuitry on the two die and form interconnects between said circuitry.

8. The semiconductor device of claim 1 wherein one of the die is a frontplane containing an array of LEDs and the other die is a backplane containing an array of drivers for the LEDs.

9. The semiconductor device of claim 1 wherein at least some of the auxiliary bumps have a different width than the interconnect bumps.

10. The semiconductor device of claim 1 wherein at least some of the auxiliary bumps are taller than the interconnect bumps.

11. A semiconductor device comprising:
    a first die comprising first bumps, the first bumps comprising first interconnect bumps connected to circuitry on the first die and further comprising first auxiliary bumps; and
    a second die comprising second bumps, the second bumps comprising second interconnect bumps connected to circuitry on the second die and further comprising second auxiliary bumps;
    wherein the first and second interconnect bumps are bonded head-to-head to each other, thereby forming interconnects between the circuitry on the two die; and the first and second auxiliary bumps are also bonded to each other, at least some of the first and second auxiliary bumps are not aligned head-to-head and the first auxiliary bumps have a different bump-to-bump pitch than the second auxiliary bumps, thereby producing periodically non-aligned auxiliary bumps.

12. The semiconductor device of claim 11 wherein at least some others of the first and second auxiliary bumps are aligned and are bonded head-to-head to each other.

13. The semiconductor device of claim 12 wherein the first and second auxiliary bumps that are bonded head-to-head are plastically deformed.

14. The semiconductor device of claim 11 wherein the auxiliary bumps are configured to reduce misalignment of the interconnect bumps during bonding.

15. The semiconductor device of claim 11 wherein, among the non-aligned auxiliary bumps, the first auxiliary bumps are a different size than the second auxiliary bumps.

16. The semiconductor device of claim 11 wherein the first interconnect bumps comprise an array that connects to an array of circuitry on the first die, and the second interconnect bumps comprise an array that connects to an array of circuitry on the second die.

17. The semiconductor device of claim 16 wherein each of the arrays of first and second interconnect bumps has a bump-to-bump pitch of not more than 5 microns, and the first and second interconnect bumps each have an average width that is at least one third of a bump-to-bump pitch.

18. The semiconductor device of claim 16 wherein the first and second auxiliary bumps are positioned around a perimeter of the arrays of first and second interconnect bumps, respectively; and a bump-to-bump spacing of the first and second auxiliary bumps is larger than a bump-to-bump pitch of the first and second interconnect bumps, respectively.

19. The semiconductor device of claim 11 wherein at least some of the first and second auxiliary bumps are also connected to circuitry on the two die and form interconnects between said circuitry.

20. The semiconductor device of claim 11 wherein one of the die is a frontplane containing an array of LEDs and the other die is a backplane containing an array of drivers for the LEDs.

21. The semiconductor device of claim 11 wherein at least some of the auxiliary bumps have a different width than the interconnect bumps.

22. The semiconductor device of claim 11 wherein at least some of the auxiliary bumps are taller than the interconnect bumps.

\* \* \* \* \*